US008290181B2

(12) United States Patent
Stokes, III et al.

(10) Patent No.: US 8,290,181 B2
(45) Date of Patent: Oct. 16, 2012

(54) AUTOMATIC AUDIO GAIN CONTROL FOR CONCURRENT CAPTURE APPLICATIONS

(75) Inventors: Jack W. Stokes, III, North Bend, WA (US); John Platt, Redmond, WA (US); David Alan Stevens, Sammamish, WA (US)

(73) Assignee: Microsoft Corporation, Redmond, WA (US)

( * ) Notice: Subject to any disclaimer, the term of this patent is extended or adjusted under 35 U.S.C. 154(b) by 2109 days.

(21) Appl. No.: 11/084,608

(22) Filed: Mar. 19, 2005

(65) Prior Publication Data
US 2006/0210096 A1   Sep. 21, 2006

(51) Int. Cl.
*H03G 3/00* (2006.01)
*H03G 9/00* (2006.01)
(52) U.S. Cl. ............. 381/107; 381/102; 381/104
(58) Field of Classification Search .......... 381/102–109, 381/91, 11, 92, 111, 122; 704/225, 270; 700/94
See application file for complete search history.

(56) References Cited

U.S. PATENT DOCUMENTS

| 5,329,243 | A | 7/1994 | Tay |
| 5,632,002 | A | 5/1997 | Hashimoto |
| 6,122,331 | A | 9/2000 | Dumas |
| 6,151,400 | A | 11/2000 | Seligman |
| 6,577,852 | B1 | 6/2003 | Iwata |
| 6,704,704 | B1 * | 3/2004 | Newson et al. ............... 704/225 |
| 6,940,987 | B2 | 9/2005 | Claesson |
| 6,996,445 | B1 | 2/2006 | Kamijo |
| 7,065,164 | B1 | 6/2006 | Sakima |
| 7,142,665 | B2 | 11/2006 | Barron |
| 7,298,852 | B2 | 11/2007 | Croft |
| 7,408,442 | B2 * | 8/2008 | LeBlanc et al. .......... 340/286.11 |
| 7,502,480 | B2 | 3/2009 | Baudisch |

FOREIGN PATENT DOCUMENTS

| JP | 58-105019 | 7/1983 |
| JP | 61-273006 | 3/1986 |
| JP | 05-198089 | 8/1993 |
| JP | 06-085583 | 3/1994 |
| JP | 07-140998 | 6/1995 |
| JP | 08-083157 | 3/1996 |
| JP | 08-265893 | 10/1996 |

(Continued)

OTHER PUBLICATIONS

Applicant's admitted prior art. Figure 2. p. 15, line 16-p. 16, line 19. No date available.*

(Continued)

*Primary Examiner* — Devona Faulk
(74) *Attorney, Agent, or Firm* — Lyon & Harr, LLP; Mark A. Watson

(57) ABSTRACT

A system level automatic gain control ("System AGC") automatically initializes and controls analog microphone gain in an environment where multiple independent applications simultaneously receive an input from a single analog microphone or microphone array. In one embodiment, the System AGC also prevents those applications from acting to separately control the gain by intercepting external gain control commands and responding to the corresponding application with a corresponding digital gain applied to the input signal from the microphone. Consequently, the System AGC avoids problems relating to oscillations and instability in the microphone gain resulting from multiple applications trying to simultaneously control the gain while preventing each application from adversely affecting the quality of another application's audio capture signal. Further, in one embodiment, the System AGC also acts to maximize the signal to noise (SNR) ratio of the microphone without introducing clipping as a function of a sampled background environment.

19 Claims, 8 Drawing Sheets

FOREIGN PATENT DOCUMENTS

| | | |
|---|---|---|
| JP | 10-276091 | 10/1998 |
| JP | 2000-066671 | 3/2000 |
| JP | 2001-111384 | 4/2001 |
| JP | 2002-151975 | 5/2002 |
| JP | 2004-206748 | 7/2004 |

OTHER PUBLICATIONS

Isaac Martinez G.; "Automatic Gain Control (AGC) Circuits, Theory and Design"; University of Toronto; Fall 2001.

\* cited by examiner

AUTOMATIC AUDIO GAIN CONTROL FOR CONCURRENT CAPTURE APPLICATIONS

BACKGROUND

1. Technical Field

The invention is related to audio input signal gain control, and in particular, to a system and method for providing an automatic system level gain control for allowing an audio signal, such as a microphone signal, "line in" audio signal, CD audio signal, etc., to be simultaneously provided to multiple separate audio capture or processing applications while providing a centralized gain control for each audio input source.

2. Related Art

Conventional analog microphones, including individual microphones and microphone array type devices, are well known to those skilled in the art. When connected to a computing device, such as a personal computer (PC) or the like, such microphones are frequently used in applications including, for example, voice over IP (VoIP) clients or speech recognition engines, which receive an audio signal captured by the microphone, and then process that signal in accordance with the application parameters.

Unfortunately, typical computing systems originally allowed only one application to capture data from a hardware device's microphone at any one time. In the event that a second application attempted to capture data from the same microphone simultaneously with a first application, the second application would typically be denied access to the microphone signal being accessed by the first application. As a result, applications requiring real-time feed from a microphone were not typically capable of simultaneous operation.

Therefore, in an attempt to address this problem, one conventional scheme was implemented to provide a method whereby the audio input of a microphone could be simultaneously provided to multiple applications. For example, in current versions of the Microsoft® Windows® operating system, beginning with the "Millennium Edition" version of Windows®, a system level driver having a filename of "splitter.sys" was provided to create two or more identical output streams from a single input capture stream. In general, the "splitter.sys" driver transparently copies the input stream to two more output streams independently of the format of the input stream, and then provides copies of that stream to whatever application requests a copy.

Unfortunately, while the new audio signal splitting feature provided by splitter.sys addressed the problem of being unable to simultaneously provide an audio input to two or more concurrent applications, it created a potential new problem for a number of applications that capture data from a microphone. In particular, many audio capture applications often attempt to optimize the signal-to-noise ratio (SNR) of the microphone signal by continuously controlling the analog gain of the preamp(s) associated with the microphone's analog to digital converters (A/Ds). Consequently, if multiple capture applications are capturing data from a microphone, any two or more of those applications may be simultaneously attempting to control the microphone's analog gain, thereby likely degrading the microphone's signal.

For example, applications such as VoIP clients or speech recognition engines often try to control the analog microphone gain in order to maximize the SNR ratio without introducing clipping. In this case, multiple closed loop gain control systems will be trying to adjust the single analog microphone gain in isolation. This scenario often leads to oscillations of the microphone gain, which in the worst case, forces the analog microphone gain to either the minimum value or maximum value supported by the microphone's preamp because of the inherent instability of competing gain control systems. If the gain is forced to the minimum value, the microphone will only record silence or a signal that is too quiet. Conversely, if the gain is forced to the maximum value, near end speech may be seriously distorted due to a significant amount of clipping.

Therefore, what is needed is a system and method for providing simultaneous access of an incoming microphone signal, while maintaining gain control over the microphone. Further, such a system and method should also be capable of operation with applications designed separately to control the microphone gain by intercepting the gain control commands from such applications, and preventing those applications from affecting the microphone gain.

SUMMARY

As is well known to those skilled in the art, conventional microphones, including individual microphones and microphone arrays, typically include an arrangement of one or more microphones in some predetermined layout. In general, each microphone typically includes an associated preamplifier for providing amplification or gain for the analog audio signals captured by each microphone. While some applications allow manual adjustment of the microphone gain, many applications are designed to automatically adjust the microphone gain. As a result, many such applications are not capable of simultaneous operation without causing gain instability as a result of competing gain control systems. Similar issues exist with respect to controlling gain of other audio inputs to a computing device, including any other analog audio source, such as, for example, CD audio and "line in" signals.

Therefore, to address this issue, a system level automatic gain control ("System AGC") is provided for automatically initializing and controlling the analog gain of an audio input source in an environment where multiple independent applications are simultaneously requesting or receiving an input from a single audio input. Note that for purposes of explanation, the following discussion will generally refer to the use of a microphone or microphone array as the audio input source. However, it should be understood that the exemplary use of a microphone as the audio input source is easily generalized to other audio input sources, as noted above, and that the System AGC described herein is not intended to be limited to use with only microphones as the audio input source. Further, the example of a "speech signal" being captured by the microphone is also used herein for purposes of explanation. However, it should be appreciated that in addition to being capable of operating with any type of conventional audio input source, the System AGC is equally capable of operating with any type of audio signal being input into the computing device via such sources.

In one embodiment, the System AGC acts to maximize the signal to noise (SNR) ratio of the microphone without introducing clipping of the desired recorded speech signal. Further, in order to avoid clipping, the analog gain is generally set to leave as much headroom as possible while still providing an adequate number of bits to digitize a useful signal.

In another embodiment, the System AGC also prevents individual applications from acting to separately control the gain by intercepting external gain control commands and responding to the corresponding application with a corresponding digital gain applied to the input signal from the microphone. As a result, the applications continue to behave normally and are unaware that they are not actually controlling the microphone gain. Consequently, the System AGC avoids problems relating to oscillations and instability in the microphone gain resulting from multiple applications trying to simultaneously control the gain while preventing each application from adversely affecting the quality of another application's audio capture signal.

In one embodiment, the gain control of the System AGC is based on an estimate of a background noise floor envelope. In contrast, conventional gain control systems typically attempt to maintain a relatively constant amplitude or power for signals of varying power captured at different positions relative to the microphone, such as for example, individuals speaking with various speech levels or power or at various positions or distances relative to the microphone. However, it should be noted the System AGC is also capable of operating with conventional gain control techniques, such as that described above.

The System AGC also differs from conventional gain control algorithms in that it operates to maintain a relatively constant gain without producing a clipped (i.e. saturated) speech signal or a speech signal that is too quiet. Under normal conditions, the analog microphone gain set by the System AGC does not change unless the background noise floor changes. Further, clipping can be easily detected or predicted from the data captured by the microphone using conventional techniques, including various forms of signal extrapolation. An estimate of the background noise floor envelope is then used to detect conditions where the analog microphone gain is set too low. Consequently, by estimating the background noise floor envelope instead of trying to track the signal peak, the System AGC described herein is immune to widely varying speech signals, such as a speech signals that may be produced by speaking individuals in motion relative to the microphone.

In view of the above summary, it is clear that the System AGC described herein provides a unique system and method for providing an automatic system level gain control for controlling audio input gain while simultaneously providing the audio signal input to multiple independent applications. In addition to the just described benefits, other advantages of the System AGC will become apparent from the detailed description which follows hereinafter when taken in conjunction with the accompanying drawing figures.

DESCRIPTION OF THE DRAWINGS

The specific features, aspects, and advantages of the present invention will become better understood with regard to the following description, appended claims, and accompanying drawings where:

DETAILED DESCRIPTION OF THE PREFERRED EMBODIMENTS

In the following description of the preferred embodiments of the present invention, reference is made to the accompanying drawings, which form a part hereof, and in which is shown by way of illustration specific embodiments in which the invention may be practiced. It is understood that other embodiments may be utilized and structural changes may be made without departing from the scope of the present invention.

Figure 1:
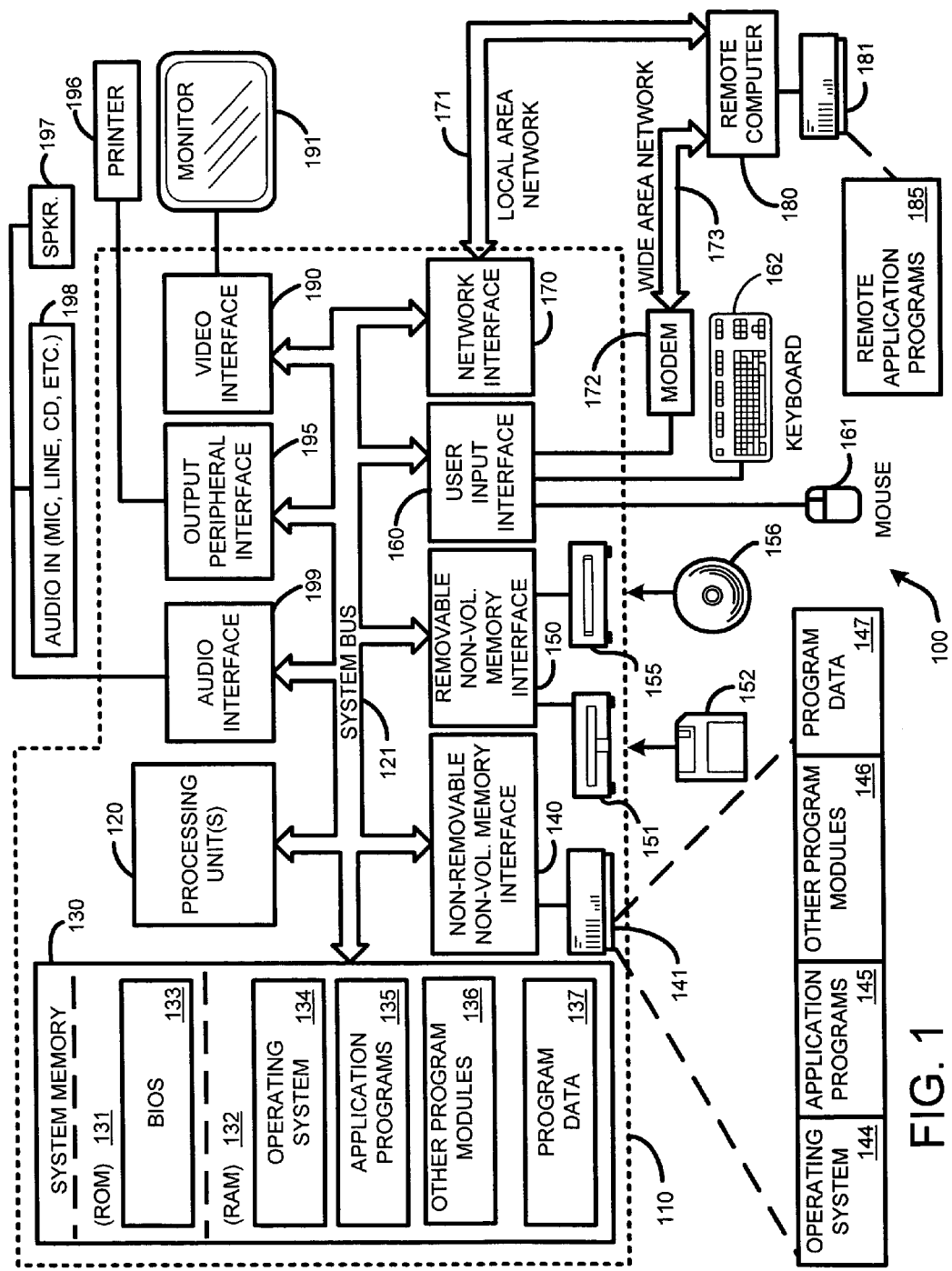
FIG. 1 is a general system diagram depicting a general-purpose computing device constituting an exemplary system for interfacing with an audio input, such as a microphone or microphone array, a "line in," a CD input, etc., with gain control and signal distribution provided by a system level automatic gain control ("System AGC").

1.0 Exemplary Operating Environment:

FIG. 1 illustrates an example of a suitable computing system environment 100 with which the invention may be implemented. The computing system environment 100 is only one example of a suitable computing environment and is not intended to suggest any limitation as to the scope of use or functionality of the invention. Neither should the computing environment 100 be interpreted as having any dependency or requirement relating to any one or combination of components illustrated in the exemplary operating environment 100.

The invention is operational with numerous other general purpose or special purpose computing system environments or configurations. Examples of well known computing systems, environments, and/or configurations that may be suitable for use with the invention include, but are not limited to, personal computers, server computers, hand-held, laptop or mobile computer or communications devices such as cell phones and PDA's, multiprocessor systems, microprocessor-based systems, set top boxes, programmable consumer electronics, network PCs, minicomputers, mainframe computers, distributed computing environments that include any of the above systems or devices, and the like.

The invention may be described in the general context of computer-executable instructions, such as program modules, being executed by a computer in combination with hardware modules, including components of one or more audio inputs 198, such as, for example, microphones or microphone arrays, "line in" signals, CD audio inputs, etc. Generally, program modules include routines, programs, objects, components, data structures, etc., that perform particular tasks or implement particular abstract data types. The invention may also be practiced in distributed computing environments where tasks are performed by remote processing devices that are linked through a communications network. In a distributed computing environment, program modules may be located in both local and remote computer storage media including memory storage devices. With reference to FIG. 1, an exemplary system for implementing the invention includes a general-purpose computing device in the form of a computer 110.

Components of computer 110 may include, but are not limited to, a processing unit 120, a system memory 130, and a system bus 121 that couples various system components including the system memory to the processing unit 120. The system bus 121 may be any of several types of bus structures including a memory bus or memory controller, a peripheral bus, and a local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus also known as Mezzanine bus.

Computer 110 typically includes a variety of computer readable media. Computer readable media can be any available media that can be accessed by computer 110 and includes both volatile and nonvolatile media, removable and non-removable media. By way of example, and not limitation, computer readable media may comprise computer storage media and communication media. Computer storage media includes volatile and nonvolatile removable and non-removable media implemented in any method or technology for storage of information such as computer readable instructions, data structures, program modules, or other data.

Computer storage media includes, but is not limited to, RAM, ROM, PROM, EPROM, EEPROM, flash memory, or other memory technology; CD-ROM, digital versatile disks (DVD), or other optical disk storage; magnetic cassettes, magnetic tape, magnetic disk storage, or other magnetic storage devices; or any other medium which can be used to store the desired information and which can be accessed by computer 110. Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared, and other wireless media. Combinations of any of the above should also be included within the scope of computer readable media.

The system memory 130 includes computer storage media in the form of volatile and/or nonvolatile memory such as read only memory (ROM) 131 and random access memory (RAM) 132. A basic input/output system 133 (BIOS), containing the basic routines that help to transfer information between elements within computer 110, such as during start-up, is typically stored in ROM 131. RAM 132 typically contains data and/or program modules that are immediately accessible to and/or presently being operated on by processing unit 120. By way of example, and not limitation, FIG. 1 illustrates operating system 134, application programs 135, other program modules 136, and program data 137.

The computer 110 may also include other removable/non-removable, volatile/nonvolatile computer storage media. By way of example only, FIG. 1 illustrates a hard disk drive 141 that reads from or writes to non-removable, nonvolatile magnetic media, a magnetic disk drive 151 that reads from or writes to a removable, nonvolatile magnetic disk 152, and an optical disk drive 155 that reads from or writes to a removable, nonvolatile optical disk 156 such as a CD ROM or other optical media. Other removable/non-removable, volatile/nonvolatile computer storage media that can be used in the exemplary operating environment include, but are not limited to, magnetic tape cassettes, flash memory cards, digital versatile disks, digital video tape, solid state RAM, solid state ROM, and the like. The hard disk drive 141 is typically connected to the system bus 121 through a non-removable memory interface such as interface 140, and magnetic disk drive 151 and optical disk drive 155 are typically connected to the system bus 121 by a removable memory interface, such as interface 150.

The drives and their associated computer storage media discussed above and illustrated in FIG. 1, provide storage of computer readable instructions, data structures, program modules and other data for the computer 110. In FIG. 1, for example, hard disk drive 141 is illustrated as storing operating system 144, application programs 145, other program modules 146, and program data 147. Note that these components can either be the same as or different from operating system 134, application programs 135, other program modules 136, and program data 137. Operating system 144, application programs 145, other program modules 146, and program data 147 are given different numbers here to illustrate that, at a minimum, they are different copies. A user may enter commands and information into the computer 110 through input devices such as a keyboard 162 and pointing device 161, commonly referred to as a mouse, trackball, or touch pad.

Other input devices (not shown) may include a joystick, game pad, satellite dish, scanner, radio receiver, and a television or broadcast video receiver, or the like. These and other input devices are often connected to the processing unit 120 through a wired or wireless user input interface 160 that is coupled to the system bus 121, but may be connected by other conventional interface and bus structures, such as, for example, a parallel port, a game port, a universal serial bus (USB), an IEEE 1394 interface, a Bluetooth™ wireless interface, an IEEE 802.11 wireless interface, etc. Further, the computer 110 may also include a speech or audio input device, such as a microphone or a microphone array, "line-in" CD or DVD audio input, etc. 198, as well as a loudspeaker 197 or other sound output device connected via an audio interface 199, again including conventional wired or wireless interfaces, such as, for example, parallel, serial, USB, IEEE 1394, Bluetooth™, etc.

A monitor 191 or other type of display device is also connected to the system bus 121 via an interface, such as a video interface 190. In addition to the monitor, computers may also include other peripheral output devices such as a printer 196, which may be connected through an output peripheral interface 195.

The computer 110 may operate in a networked environment using logical connections to one or more remote computers, such as a remote computer 180. The remote computer 180 may be a personal computer, a server, a router, a network PC, a peer device, or other common network node, and typically includes many or all of the elements described above relative to the computer 110, although only a memory storage device 181 has been illustrated in FIG. 1. The logical connections depicted in FIG. 1 include a local area network (LAN) 171 and a wide area network (WAN) 173, but may also include other networks. Such networking environments are commonplace in offices, enterprise-wide computer networks, intranets, and the Internet.

When used in a LAN networking environment, the computer 110 is connected to the LAN 171 through a network interface or adapter 170. When used in a WAN networking environment, the computer 110 typically includes a modem 172 or other means for establishing communications over the WAN 173, such as the Internet. The modem 172, which may be internal or external, may be connected to the system bus 121 via the user input interface 160, or other appropriate mechanism. In a networked environment, program modules depicted relative to the computer 110, or portions thereof, may be stored in the remote memory storage device. By way of example, and not limitation, FIG. 1 illustrates remote application programs 185 as residing on memory device 181. It will be appreciated that the network connections shown are exemplary and other means of establishing a communications link between the computers may be used.

The exemplary operating environment having now been discussed, the remaining part of this description will be devoted to a discussion of the hardware and software modules and processes embodying a self-calibration system and method for automatically determining frequency-domain compensation gains for each preamplifier in a microphone array.

2.0 Introduction:

It should be noted that the following discussion generally refers to a single microphone for purposes of explanation, except where microphone arrays are specifically discussed. However, it should be clear that in view of the following discussion, a system level automatic gain control ("System AGC"), as described herein, is fully capable of operating with either one or more individual microphones, or one or more microphone arrays, or any combination thereof for controlling the gain of those microphones while providing copies of the microphone input to one or more concurrent independent applications. Further, the System AGC can apply to any analog audio source connected to a computing device, including, for example, CD or DVD audio, and "line in".

In fact, for purposes of explanation, the following discussion and associated figures will generally refer to the use of a microphone or microphone array as the audio input source. However, it should be understood that the exemplary use of a microphone as the audio input source is easily generalized to other audio input sources, such as those noted above, and that the System AGC described herein is not intended to be limited to use with microphones as the only possible audio input source. Further, the example of a "speech signal" being captured by the microphone is also used herein for purposes of explanation. However, it should be appreciated that in addition to being capable of operating with any type of conventional audio input source, the System AGC is equally capable of operating with any type of audio signal being input into the computing device via such sources.

As is well known to those skilled in the art, conventional microphones, including individual microphones and microphone arrays, typically include an arrangement of one or more microphones in some predetermined layout. In general, each microphone typically includes an associated preamplifier for providing amplification or gain for the analog audio signals captured by each microphone. Further, such microphones may also include or analog-to-digital (A/D) converters (either internal to the microphone, or within the computing device to which the microphone is connected).

While some applications allow manual adjustment of the microphone gain, many applications are designed to automatically adjust the microphone gain. As a result, many such applications are not capable of simultaneous operation without causing gain instability as a result of competing gain control systems. Therefore, when coupled to a conventional audio signal splitting system, as illustrated by the Prior Art system diagram of FIG. 2, instability in the microphone gain may result from competing gain control systems. Similar issues exist with respect to controlling gain of other audio inputs to a computing device, including any other analog audio source, such as, for example, CD or DVD audio and "line in" signals.

Figure 2:
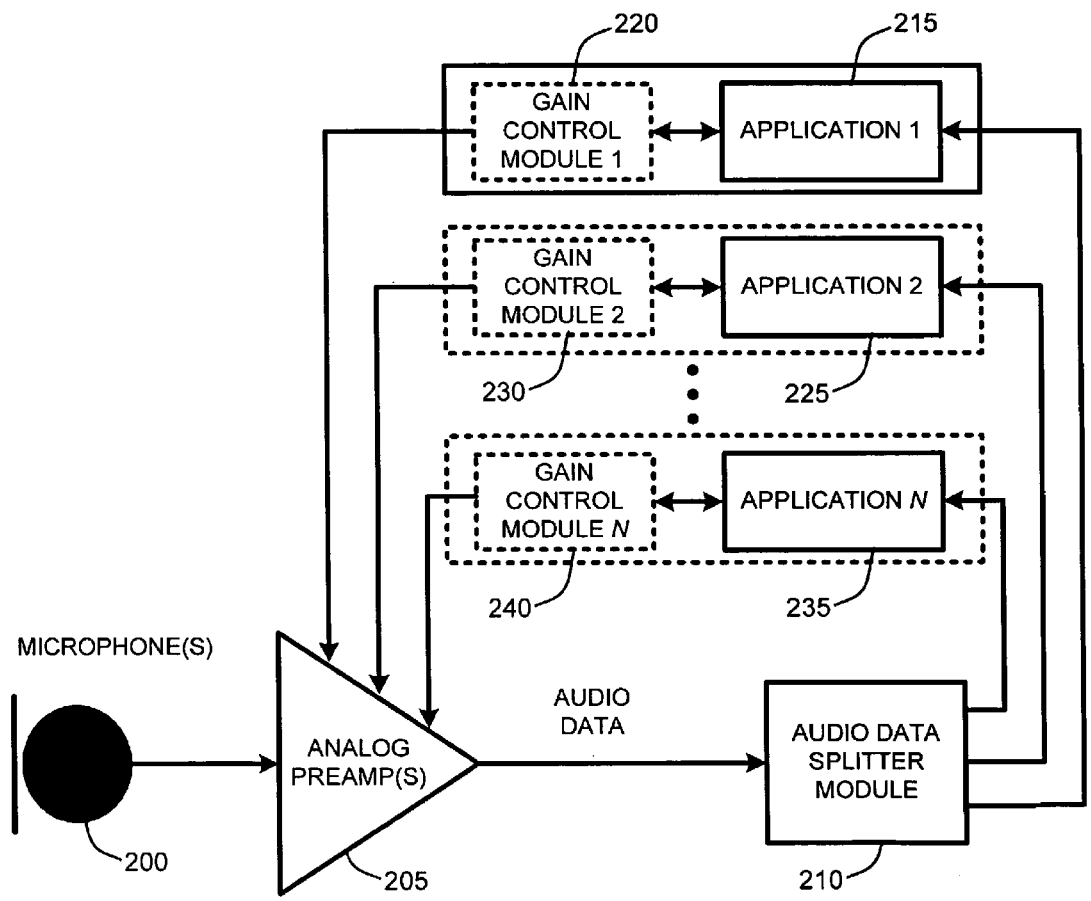
FIG. 2 illustrates a Prior Art system for splitting an incoming audio signal and simultaneously providing that split signal to a plurality of independent concurrent applications.

In particular, as illustrated by FIG. 2, conventional systems which allow multiple applications (215, 225, and 235) concurrent access to an audio stream from a microphone 200, uses an audio splitter module 210 to create two or more identical output streams from the single input audio data stream output by a preamp 205. Unfortunately, systems such as the conventional system illustrated by FIG. 2 fail to address the effect of gain control modules (220, 230, and 240) which may be included in the applications (215, 225, and 235). As a result, each of the gain control modules (220, 230, and 240) is capable of simultaneously attempting to control the gain of the microphone 200. Typically, the result of these competing gain control modules (220, 230, and 240) is a signal which is degraded as a result of fluctuating gain, or a microphone gain driven to either a minimum or maximum value, which will typically result in either a "silent" audio signal, a clipped audio signal.

The System AGC described herein addresses this issue by providing for centralized gain control, while in one embodiment, preventing independent applications from separately attempting to control the gain. In general, audio signals captured by the microphone are pre-amplified, with the gain being controlled by the System AGC, and converted to a digital signal via A/D converters and provided, again via a signal splitter component of the System AGC, to the various independent audio processing software applications residing within the computing device for further processing. It should be noted that the maximum number of simultaneous audio signals that can be transmitted to concurrent applications by the System AGC is only limited by the maximum bandwidth available to the computer for sending the digitized audio signal to the various applications.

2.1 System Overview:

In general, the System AGC described herein operates to automatically initialize and control the analog microphone gain (or the gain of any other audio input source, as noted above) in an environment where multiple independent applications are simultaneously requesting or receiving an input from a single analog microphone or microphone array. In one embodiment, the System AGC also acts to maximize the signal to noise (SNR) ratio of the microphone without introducing clipping as a function of a sampled background environment. As described in further detail below, in order to avoid clipping, the analog gain is generally set to leave as much headroom as possible while still providing an adequate number of bits to digitize a useful signal.

In one embodiment, the System AGC first estimates a background noise floor envelope, on an ongoing basis. Gain is then controlled as a function of this noise floor estimate. Alternately, the System AGC can also use conventional gain control techniques, including, for example, by acting to maintain a relatively constant amplitude or power (in either the time or frequency domain) for signals of varying power captured at different positions relative to the microphone. Signals of varying power often include, for example, individuals speaking with various speech levels or power at various positions or distances relative to the microphone. Note that these conventional gain techniques are well known to those skilled in the art for gain control of individual microphones (but not at a system level as described herein with respect to the System AGC). Consequently, in view of the discussion provided herein, the adaptation of conventional gain control techniques for use by the System AGC should be well understood by those skilled in the art.

When controlling gain as a function of the background noise, the System AGC maintains a relatively constant gain without producing a clipped (i.e. saturated) audio signal or an audio signal that is too quiet. Under normal conditions, the analog microphone gain set by the System AGC does not change unless the captured signal clips or is predicted to clip, or if the background noise floor changes. Further, clipping can be easily detected or predicted from the data captured by the microphone using conventional techniques, including various forms of signal extrapolation. An estimate of the background noise floor envelope is then used to detect conditions where the analog microphone gain is set too low. Consequently, by estimating the background noise floor envelope instead of trying to track the signal peak, the System AGC described herein is immune to widely varying speech signals, such as a speech signals that may be produced by speaking individuals in motion relative to the microphone.

Further, as noted above, in one embodiment, the System AGC also prevents individual applications from acting to separately control the gain. This capability is enabled by using conventional techniques to intercept external gain control commands issued by any of the applications. It should be noted that the concept of intercepting calls issued by an active application is a concept that is well understood by those skilled in the art, and will not be described in detail herein. Once intercepted, the System AGC responds to the application in such a way as to make the application believe that the microphone's preamp(s) has received the gain control command. The System AGC then further responds to the corresponding application with a corresponding digital gain applied to the input signal from the microphone. As a result, the applications are unaware that they are not actually controlling the microphone gain. Consequently, the System AGC avoids problems relating to oscillations and instability in the microphone gain resulting from multiple applications trying to simultaneously control the gain while preventing each application from adversely affecting the quality of another application's audio capture signal.

Figure 3:
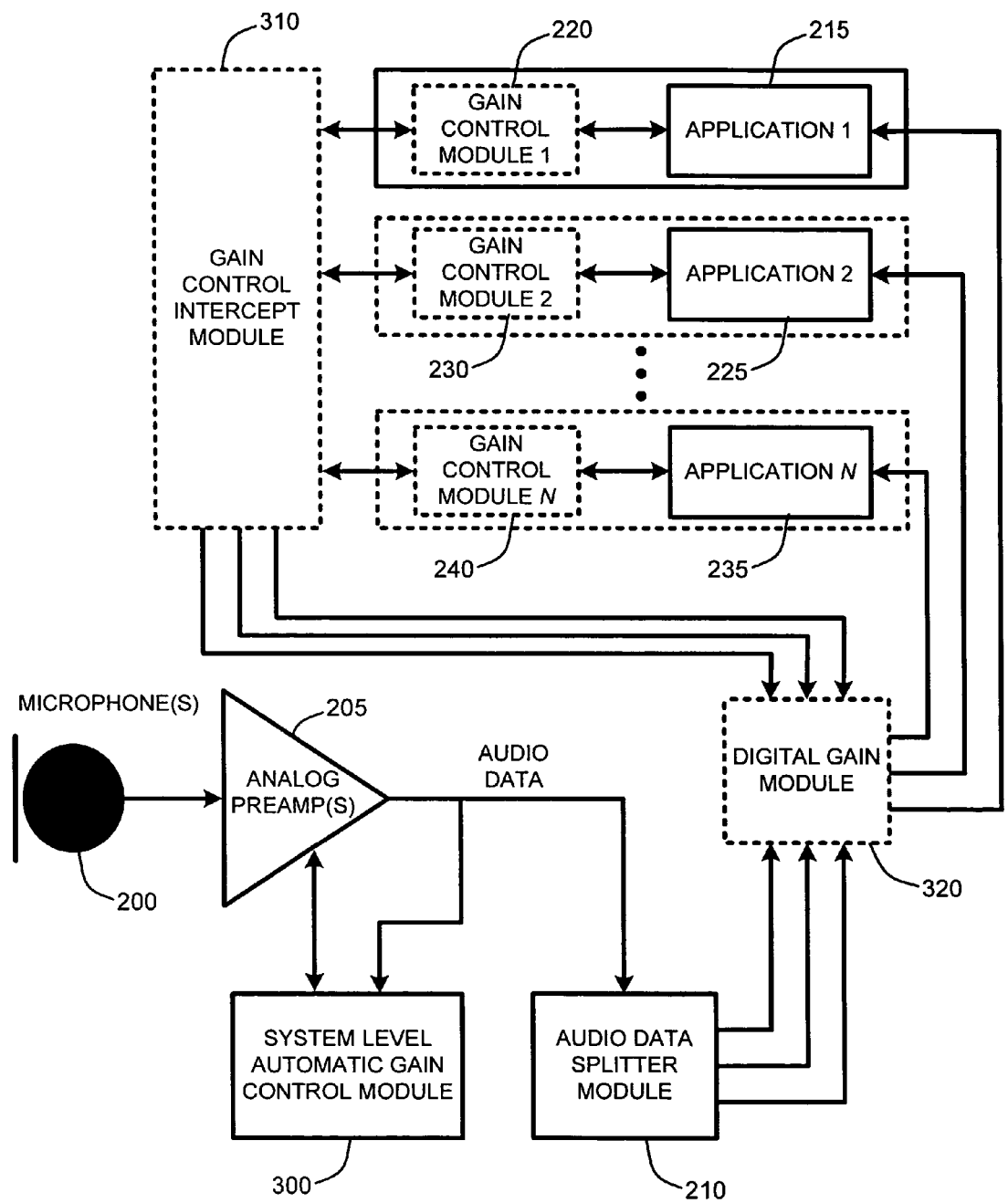
FIG. 3 illustrates an exemplary system diagram showing exemplary hardware and software modules for implementing the System AGC described herein for controlling the gain of one or more microphones or microphone arrays and distributing the microphone signal to one or more concurrent applications.

2.2 System Architecture:

The processes summarized above are illustrated by the general system diagram of FIG. 3. In particular, the system diagram of FIG. 3 illustrates the interrelationships between hardware and software modules for implementing a system level automatic gain control ("System AGC"). It should be noted that any boxes and interconnections between boxes that are represented by broken or dashed lines in FIG. 3 represent alternate embodiments of the System AGC described herein, and that any or all of these alternate embodiments, as described below, may be used in combination with other alternate embodiments that are described throughout this document. In addition, it should again be noted that while the System AGC is described with respect to one or more microphones as the audio input source in FIG. 3, the System AGC is fully capable of operating with any other audio input source connected to the computing device. Consequently, it should be clear that the use of microphones in the following discussion is for purposes of explanation only.

In general, as with the conventional system described above with respect to FIG. 2, the System AGC illustrated in FIG. 3 provides multiple applications (215, 225, and 235) concurrent access to the audio stream from the microphone 200. In addition, the System AGC also used an audio splitter module 210 to create two or more identical output streams from the single input audio data stream output by a preamp or preamps 205.

However, unlike the conventional system described with respect to FIG. 2, the System AGC Illustrated in FIG. 3 provides a system level automatic gain control module 300 for controlling the gain of the microphone(s) connected to the computing system as a function of the monitored audio data stream. The gain provided by the system level automatic gain control module 300 is the only gain that is applied to the audio data output by the microphone 200 preamp(s) 205. The preamplified audio data stream is then provided to the audio data splitter module 210, which creates two or more identical output streams from the single input audio data stream output by a preamp(s) 205.

As noted above, each of the independent applications (215, 225, and 235) may also include independent gain control modules (220, 230, and 240). Consequently, in one embodiment, the System AGC includes a gain control intercept module 310. In general, the gain control intercept module 310 uses conventional techniques to intercept external gain control commands issued by any of the applications. Once intercepted, the gain control intercept module responds to whatever application (215, 225, and/or 235) issued the gain control command via its associated gain control module (220, 230, and/or 240) in such a way as to make the application believe that the microphone has received the gain control command.

However, in addition to responding to the corresponding gain control module (220, 230, and/or 240), the gain control intercept module 310 also passes the gain requested by the corresponding gain control module to a digital gain module 320. The digital gain module then applies a digital gain to the copy of the audio data stream that is being passed to the corresponding application (215, 225, or 235) by the audio data splitter module 210. As noted above, this serves the dual purpose of preventing the applications (215, 225, and 235) from being aware that they are not actually controlling the microphone gain, while simultaneously providing an audio signal to those applications, via the digital gain module 320, having the level of gain requested by each individual application.

Finally, it should also be noted that in the case where any one or more of the applications (215, 225, and 235) does not request or order a gain change, then the only gain applied to the copy of the audio data stream being passed to that application is the original gain provided to the audio data stream via the system level automatic gain control module 300.

3.0 Operation Overview:

The above-described hardware and software modules are employed for implementing the System AGC described herein. As summarized above, the System AGC provides automatic system level gain control for one or more audio input sources, with parallel distribution of copies of the audio input signal to one or more independent applications, and in one embodiment, interception and handling of gain control commands issued by any applications independent of the System AGC. The following sections provide a detailed discussion of the operation of the System AGC, and of exemplary methods for implementing the hardware and software modules described in Section 2 with respect to the operational flow diagram of FIG. 3.

As noted above, the System AGC is capable of operating with any number or type of audio inputs, including, for example, microphones or microphone arrays, "line in" signals, CD or DVD audio, etc. However, for purposes of explanation, a generalized functional diagram for implementing a multi-channel microphone audio capture system under the control of the System AGC is described below with respect to FIG. 4. Again, it should be noted that while the System AGC is described with respect to one or more microphones as the audio input source in FIG. 4, the System AGC is fully capable of operating with any other audio input source connected to the computing device.

Figure 4:
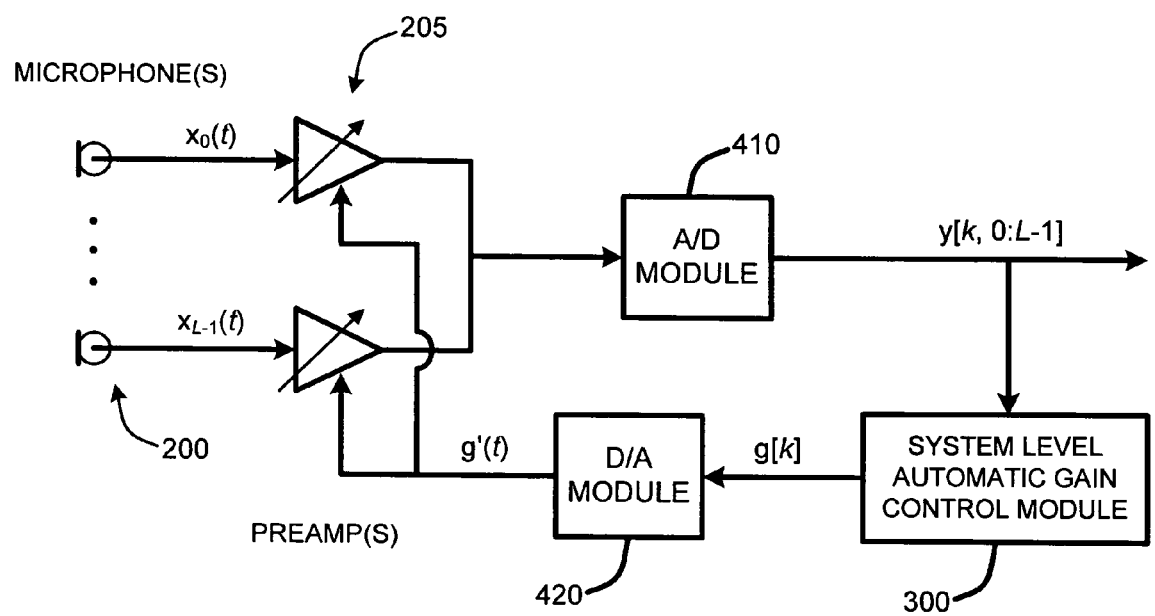
FIG. 4 provides a generalized functional diagram for implementing a multi-channel microphone audio capture system under the control of the System AGC described herein.

In particular, as illustrated by FIG. 4, one possible embodiment of a basic multi-channel audio capture system (having L channels) based on the System AGC described herein generally includes one or more microphones (or microphone arrays) 200 with associated preamp(s) 205. The raw analog audio signal captured by the $i^{th}$ channel's microphone is given by $x_i(t)$ for time t, for i=0:L−1. The analog signal is converted to an interleaved digital value, y[k,i], by an A/D module 410 for time index k and passed to the application(s). The multi-channel digital signal is then monitored by the system level automatic gain control module 300. A new digital gain computed by the system level automatic gain control module 300 is represented by g[k], while the analog gain applied to the preamp(s), following conversion of the digital gain to an analog gain by a conventional D/A module 420, is given by g'(t).

Note that while FIG. 4 shows the System AGC controlling a single gain for all microphones, it can also be used to control the individual gains for multiple microphones. It should also be noted that rather than providing an interleaved digital signal, each audio channel can be kept separate, and separate A/D converters 410 can also be used for each audio channel.

Since the system given in FIG. 4, is illustrated as a closed-loop gain control system, care must be taken to prevent the system from becoming unstable, thereby driving the analog gain to either the maximum or minimum values supported by the preamp(s). Consequently, the System AGC continuously samples the audio data stream, and adjusts the gain only when necessary, as described in further detail below with respect to FIG. 5 through FIG. 7.

In general, the processes performed by the various embodiments of the System AGC include some or all of the following steps, depending upon which embodiment is being implemented. Note that the steps that are generally described in the following paragraphs are described in further detail in the following Sections, beginning with Section 3.1 below.

Figure 5:
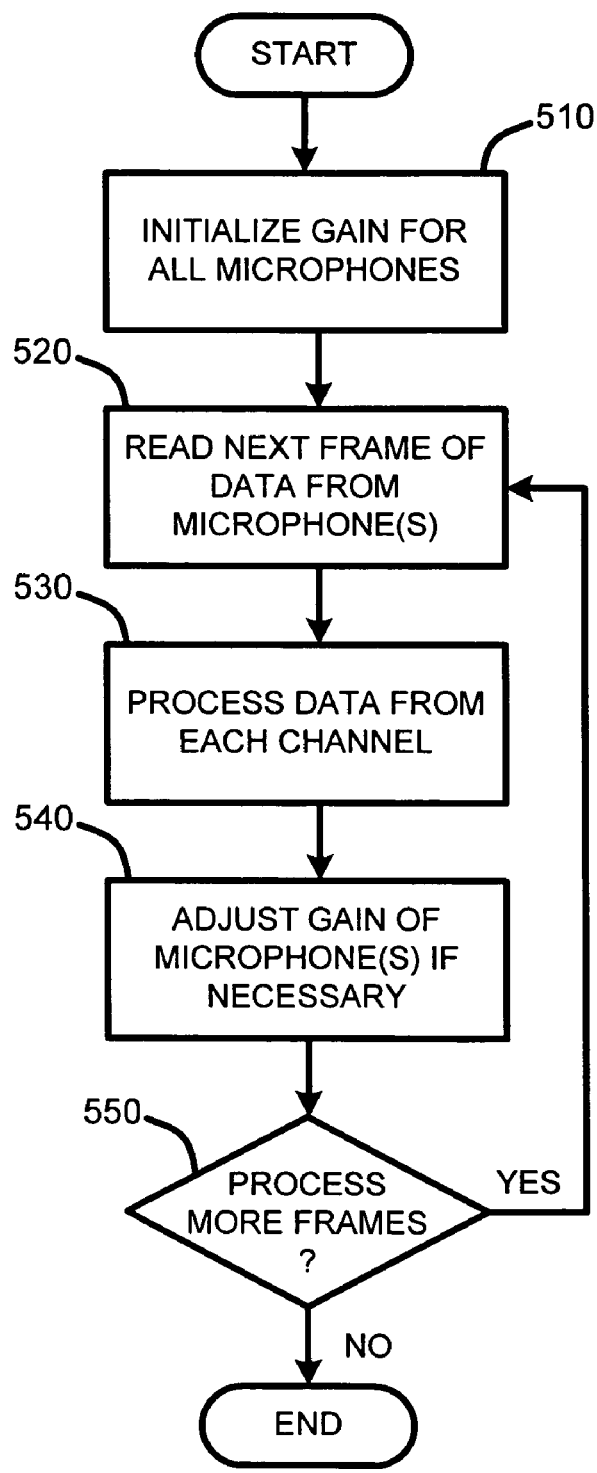
FIG. 5 provides an exemplary operational flow diagram which illustrates the overall operation of the System AGC for controlling the gain of one or more microphones or microphone arrays.

In particular, as illustrated in FIG. 5, as a first step, the System AGC initially begins operation by assigning an initial optimal analog gain to each individual microphone (or other audio input source). Typically, as is well known to those skilled in the art, many microphones include either a predetermined optimal gain value, typically supplied by the microphone vendor, or an initial microphone calibration process or "wizard" is run to determine the initial microphone gain value. Such processes for determining or otherwise identifying an initial optimal microphone gain are well known to those skilled in the art, and will not be described herein.

Next, once the initial optimal gain has been identified for each microphone, whenever an application first begins capturing data from any one or more of the microphones, the System AGC initializes 510 the corresponding microphone gain(s) to the identified optimal value, and begins receiving frames 520 of audio data from each of the microphones (e.g., data frames from each audio input channel) for as long as there are additional frames to process 550.

Figure 8:
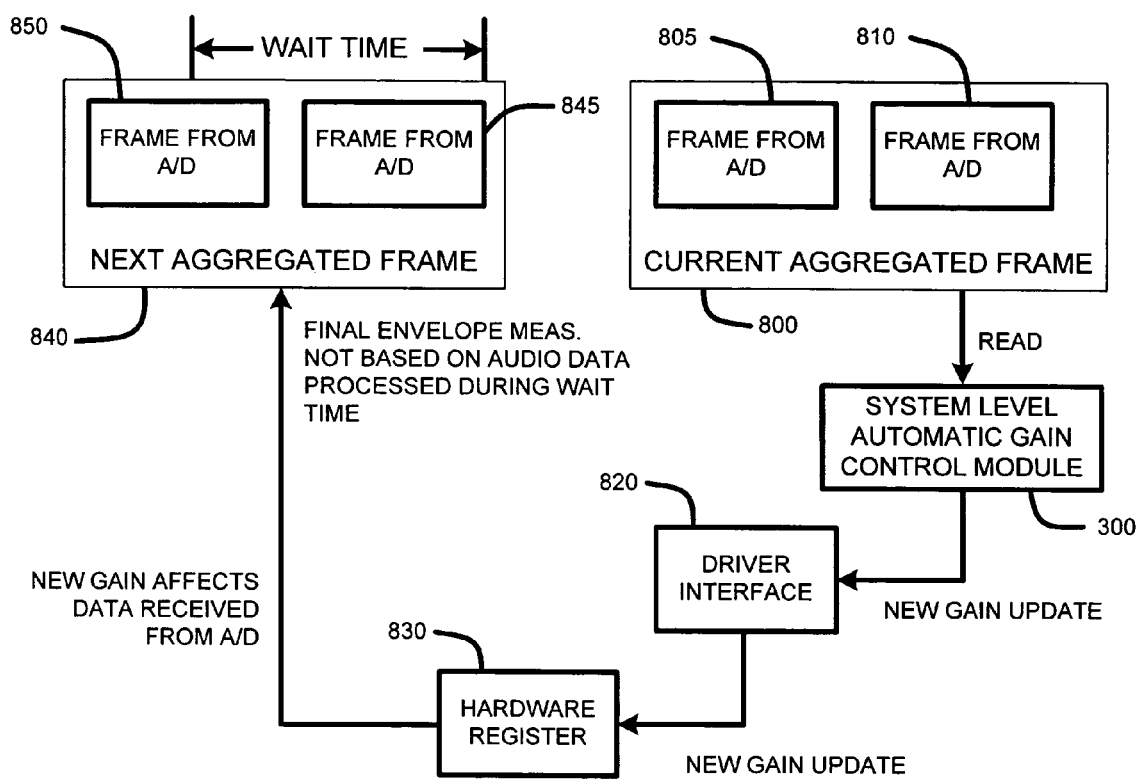
FIG. 8 provides an exemplary operational flow diagram which generally illustrates elements affecting microphone gain response times, such that future gain adjustments are delayed until an effect of an immediately prior gain adjustment has had a chance to fully affect the incoming audio signal provided by the microphone.

The System AGC then begins processing 530 the data (i.e., the current frame or "aggregated frame" read in box 520) from each channel (i.e., each microphone or other audio input) for determining whether the gain should be adjusted 540 for each channel. One embodiment of this processing 530 is specifically detailed in FIG. 6. Note that as described in further detail in Section 3.5.1, if the frames of data captured from the hardware are shorter than the maximum wait time for the system (i.e., the time for gain change orders to completely propagate through the system) plus the time required to make a new gain update estimate, the System AGC may need to aggregate two or more frames of audio data. Note that while FIG. 6 refers to an aggregated frame, FIG. 6 also applies to the case where frames are not aggregated. In particular, if the wait time is sufficiently short in a particular implementation, relative to frame length, then there is no need to aggregate frames. Otherwise, frames are aggregated as described in Section 3.5.1, and as illustrated in FIG. 8.

As noted above, and as described in further detail in Section 3.5.1, the "wait time" 620 provides a delay period that is sufficiently long so that any prior gain change order issued by the System AGC has had a chance to propagate through the system to the microphone preamplifier (or other audio input channel preamplifier) and the buffered frames recorded from the microphone. Consequently, after the wait time has expired following the previous gain change order, all of the subsequent samples in the current frame or aggregated frame will be subject to same gain.

Figure 6:
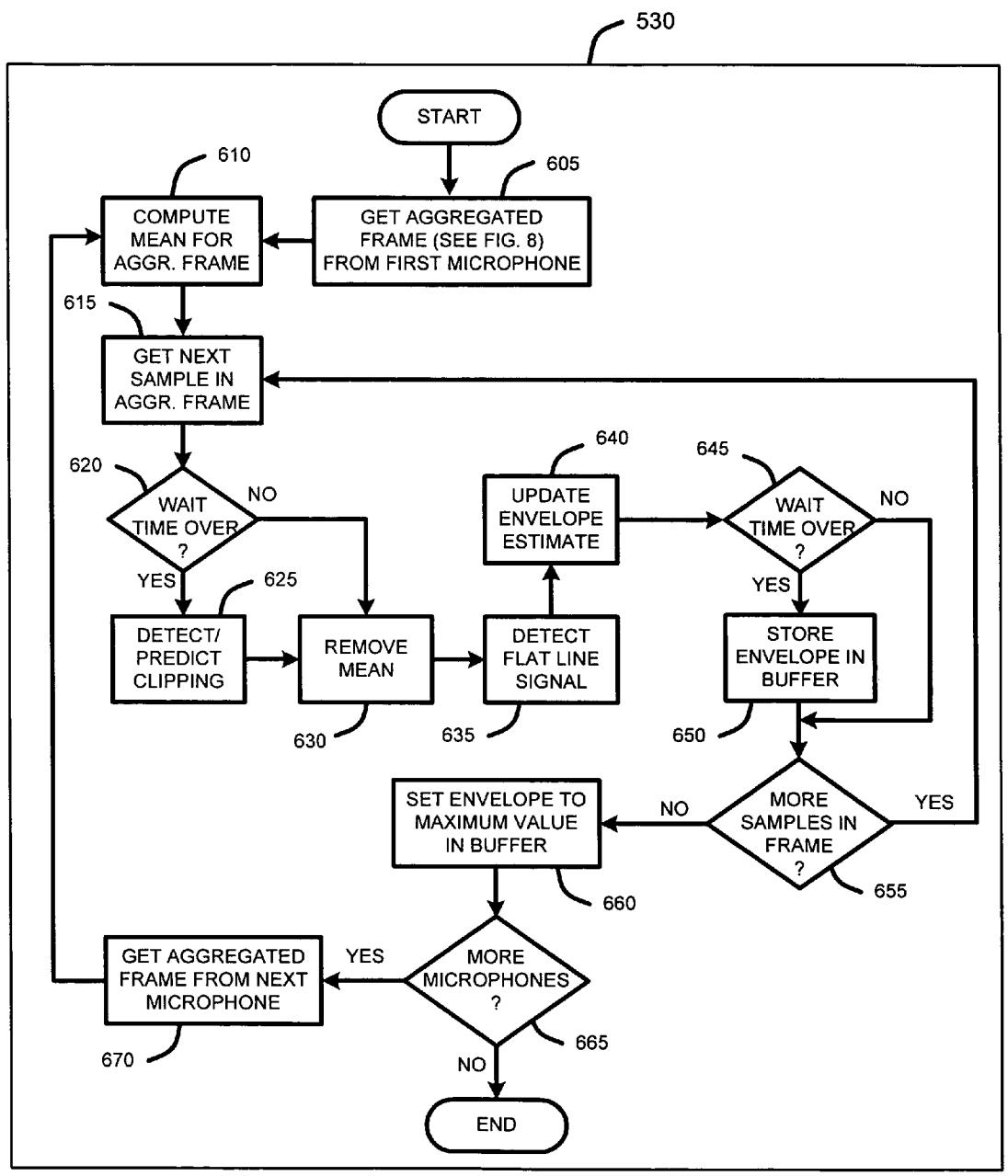
FIG. 6 provides an exemplary operational flow diagram which illustrates one embodiment of the System AGC for processing microphone audio signals to determine a local noise envelope.

As illustrated by FIG. 6, in embodiments where the gain is determined as a function of the background noise floor, the System AGC begins by getting the current aggregated frame 605 from the first microphone (or other audio channel) then computing a mean value 610 for that frame. If the "wait time" 620 has expired, the System AGC then determines for the current sample 615 of the current aggregated frame whether the digitized data from the A/D has clipped, or is predicted to clip 625. If clipping is identified or predicted 625, a flag can be set to indicate that the signal for a particular channel either has clipped or will clip at the current gain levels. If the wait time has not expired, then the detection or prediction of clipping 625 is skipped for the current sample 615 of the current aggregated frame.

In either case, whether or not the wait time has expired, the System AGC then analyzes each data frame for each channel to determine whether there is a flat line signal 635 (typically resulting either from a zero gain or from a disconnected microphone) by subtracting 630 the computed mean 610 from the current aggregated frame and analyzing the remainder.

For each audio channel, the System AGC then computes a low-pass filtered version of the absolute value of the microphone signal for all samples in each frame to estimate the background noise floor envelope 640. If the wait time has already expired 645, then the noise floor envelope is stored 650 in a buffer for later use. Note that the use of circular or first-in first-out type buffers is preferred here, but not required, due to the generally small memory requirements of such buffers. This process (boxes 615 through 650) then continues for each sample (655, 615) in the current aggregated frame until all of the samples in the current aggregated frame have been processed. The maximum value of the noise floor envelope stored 650 to the buffer for the current frame is then selected 660 as the noise envelope for the current channel and aggregated frame. It should be noted that if the samples collected after the "wait time" in the aggregated frame contain speech instead of noise, this aggregated frame will not be an accurate estimate of the noise floor. However, this poor estimate of the noise floor will not adversely affect the performance of the System AGC.

The steps described above, (boxes 610 through 660) then repeat (665, 670) for the current aggregated frame of each microphone (or other audio channel), as indicated by the loop in FIG. 6. It should be noted that in an alternate embodiment of the steps shown in FIG. 6, the algorithm can compute some of the blocks including 610, 630, 635 and 640 after receiving a frame of data from the microphone instead of waiting for the entire aggregated frame to be read.

Referring now back to FIG. 5, in the case of a single global gain value for all microphones, if the signal of any channel has clipped, or is predicted to clip, then the global gain for all channels is reduced 540, and the steps described above are repeated for the next frame of the incoming audio data stream. Alternately, the gain is reduced 540 independently for individual clipping channels where individually addressable preamps are available for each microphone.

Conversely, in the case of a single global gain value for all microphones, if the minimum value of all of the maximum envelope values from each channel is less than some predetermined threshold level (relative to the maximum level after which the signal will be clipped), then the global gain for all channels is increased 540, and the steps described above are repeated for the next frame of the incoming audio data stream. Alternately, the gain 540 is increased independently for individual channels having a maximum envelope value below the threshold level where individually addressable preamps are available for each microphone.

Figure 7:
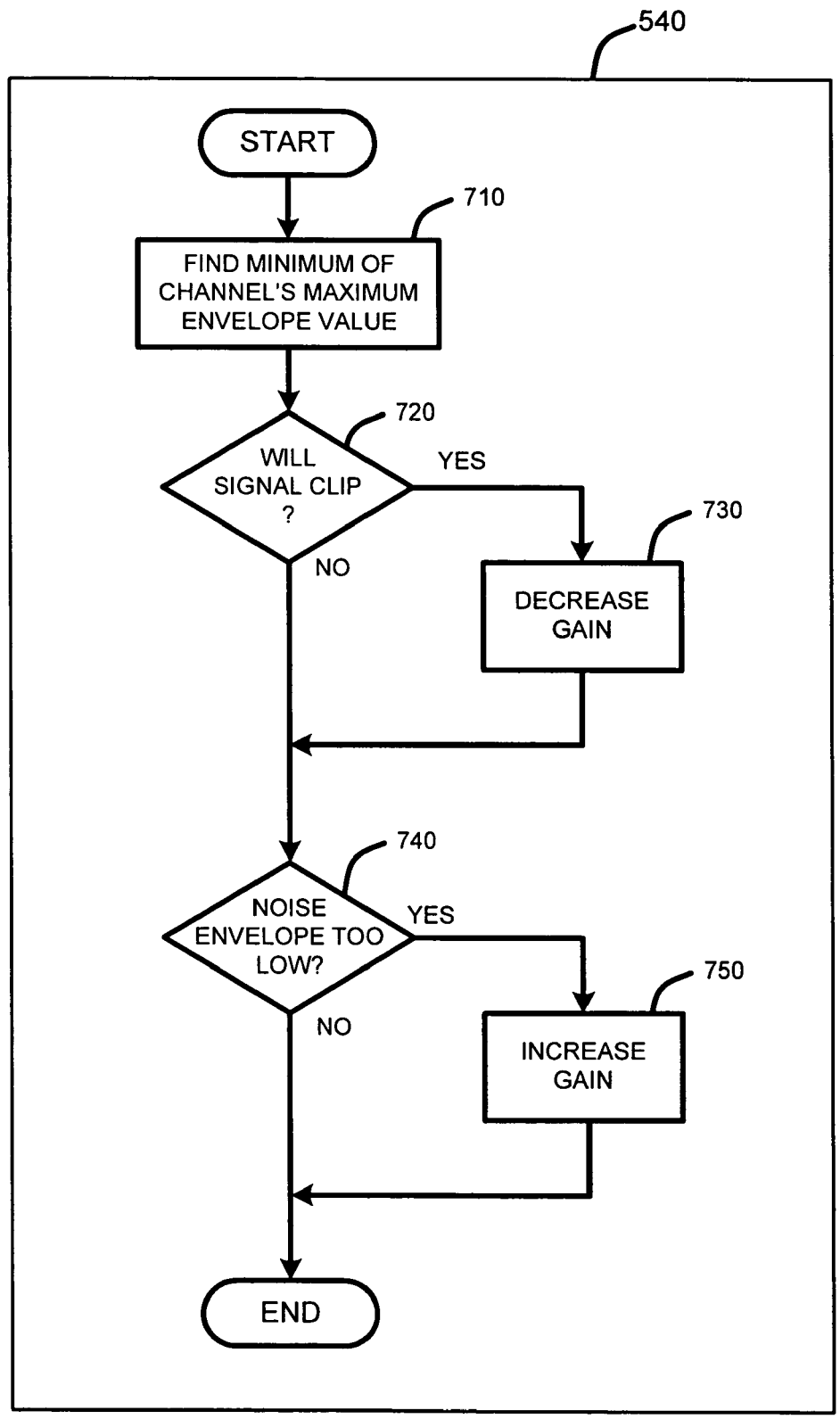
FIG. 7 provides an exemplary operational flow diagram which illustrates one embodiment of the System AGC for adjusting the microphone gain as a function of the local noise envelope with respect to a clipping level for a sampled window of the audio signal.

These gain control concepts (e.g., box 540) are generally illustrated by the flowchart of FIG. 7. In particular, as illustrated by FIG. 7, given the aforementioned analysis 710 of each audio channels noise envelope, a determination 720 is made as to whether the corresponding signal will clip. If the signal will clip, then the gain is decreased 730. If the signal will not clip, and the noise envelope is too low 740, then the gain will be increased 750.

3.1 Initializing Microphone Gain:

As noted above, when microphones (or other audio input source) under the control of the System AGC first begin capturing an audio signal, the System AGC initializes the analog microphone gain to a known, optimal gain setting. This initial analog microphone gain can be set in a number of ways including by an audio tuning wizard, by a value specified by the computer manufacturer or hardware manufacturer, by learning the optimal value during periods of normal near-end speech and background noise or by a combination of these methods. Note that such techniques are well known to those skilled in the art, and will only be generally described herein.

For example, in the first scenario, an "audio tuning wizard" similar to the conventional systems used by Microsoft® Windows® Messenger or the Speech Recognition engine included in current versions of Microsoft® Office is used to initialize the gain. For example, such conventional audio tuning wizards typically prompt the user to speak into the microphone(s). The wizard then automatically adjusts the microphone gain to a desired level. One advantage of using a conventional audio tuning wizard is that the operating system can detect and prompt the user to turn off background noise sources such as televisions, radios, etc. in order to ensure the initial gain is set correctly.

In the second scenario, the hardware manufacturer has already specified the desired analog microphone gain based on both the individual microphone hardware and, if separate, the preamp and A/D hardware. Note that digital microphones such as USB, 1394, or Bluetooth microphones integrate the microphone(s), preamp(s), and A/D(s) in the product, any of which is capable of being used by the System AGC described herein. Alternatively for analog microphones and sound cards, which are typically produced by separate vendors, the hardware vendor can specify the analog microphone gain based on the microphone and sound card included with the computer. Another possibility is that the user may specify the analog microphone type and the sound card, and the operating system will then select an optimal gain value. In addition, the sound capture hardware can measure the impedance of the microphone, which in combination with the manufacturer and model number, can be used to set the initial optimal gain.

In the third scenario, the operating system operates to identify periods of normal levels of near-end speech and background noise. Normal levels of near-end speech include periods where either the peak or average near-end speech power is measured to be in some reasonable range. Normal levels of background noise can include periods were the background noise appears to be stationary. Normal levels of background noise do not include periods where the television is on, the stereo is playing, or people are speaking in the background. These normal levels are then used for learning the initial optimal value using conventional, and well known, techniques.

Regardless of which method is used to select the initial optimal gain, whenever a first application is started that wants to capture data from the microphone (or other audio input), the system AGC will read the optimal, analog microphone gain and set the preamp gain to this value. If a second application later begins capturing data from the microphone (or other audio input) in parallel with the first application, the system AGC will not attempt to reset the current microphone gain, but will continue to use the current gain setting, which may have been changed from the initial optimal value due to the current speech from the desired user or other background noise.

3.2 Detecting or Predicting Clipping:

As is well known to those skilled in the art, clipping is a non-linear effect on the captured data, which is typically avoided, if at all possible. In particular, clipping can significantly reduce the ability of digital signal processing algorithms to work correctly. To provide just one example, it is well known that conventional acoustic echo cancellation (AEC) algorithms may not be able to remove an echo fed back from the speakers to the microphone signal in the presence of a clipped signal. Typical AEC algorithms work by modeling the impulse response in the room with a linear, time-varying adaptive filter which cannot model the non-linear effect from clipping. During clipping, the AEC algorithm cannot accurately steer the adaptive filter coefficients in order to cancel the echo from the speakers.

In one embodiment, clipping is detected simply as a function of the digital value of the maximum sample value in a given frame of audio data. Note that the use of the term "frame" in the following discussion is also intended to refer to the "aggregated frames" described herein in the case that it is necessary to aggregate frames because of the "wait time" required for gain change orders to propagate through the system. In particular, if the sample read from the A/D is equal to the maximum positive value (e.g., 32767 for a signed, 16-bit A/D) or equal to the maximum negative value (e.g., −32768 for a signed, 16-bit A/D), it is likely that the analog signal input to the A/D was probably outside of the range that can be digitized by the A/D. Consequently, the signal is assumed to have been clipped. This detection of clipping can be considered as a prediction of future clipping, because once a signal clips, it is likely to clip again.

Alternatively, in another embodiment, rather than actually waiting until clipping has occurred, the System AGC operates to predict that clipping is about to occur, and then to adjust the gain as if clipping actually had occurred so as to avoid clipping if possible. There are a large number of conventional techniques for predicting a signal level, and thus whether the signal is likely to clip, based on an evaluation of current signal levels. For example, in one embodiment, a prediction of clipping is made whenever the magnitude of the signal is greater than some fixed or adjustable percentage (e.g. 95%) of the full scale magnitude of the signal. In another embodiment, the current signal is extrapolated into the future to determine whether the future signal is likely to clip. Again signal extrapolation is a technique that is well known to those skilled in the art, and will not be described herein. Note that signal extrapolation techniques can also be used in combination with clipping threshold levels, such that if the extrapolated level exceeds the threshold level (e.g. 95%) of the full scale magnitude of the signal, then the signal is again predicted to clip.

Regardless of whether the System AGC uses actual clipping, or a prediction of clipping, once the system AGC decides that future clipping is likely, the System AGC orders the gain to be reduced by some amount, as described in further detail in Section 3.6, so as to reduce the likelihood of future clipping.

3.3 Computing and Removing the Mean:

As noted above, in one embodiment, the System AGC controls the gain as a function of the computed noise floor envelope. Therefore in this embodiment, before detecting the noise floor envelope, it is first necessary to estimate and remove the mean. Estimating the mean must be done before processing any samples in the frame (or aggregated frame). For a frame of data y, (which includes multiple channels), the mean μ for each channel i is simply estimated as indicated by Equation 1:

$$\mu(i) = \frac{1}{N}\sum_{k=0}^{N-1} y(k, i)$$ Equation 1 where N is the frame length and k is the sample index in the frame.

As noted above, the mean calculated for the current frame of data is then removed before estimating the noise floor envelope. For a frame of data y, the mean μ, for channel i, is removed as indicated by Equation 2:

$$y_{Mean}(k,i) = y(k,i) - \mu(i)$$ Equation 2 for each sample k.

3.4 Checking for Flat Line Signals:

When a microphone (or other audio input) is disconnected, the resulting signal captured from the audio front end is called a flat line signal. Since the microphone is disconnected, increasing the gain will produce a gain that is too high when the microphone is eventually connected. Therefore, the gain will not be increased by the System AGC in any case where it is determined that a flat line signal (indicating a disconnected microphone) is detected. There are a number of ways to check for a flat line signal, including searching for samples being approximately equal to zero. However, there is typically some level of electrical "noise" or bias in the preamps (assuming an analog microphone separate from a preamp).

Consequently, one simple check for a flat line signal is to first remove the mean from the signal, as illustrated above with respect to Equation 2 (and in FIG. 6), and then to simply look at the remaining signal level. However, the data for a flat line signal often also contains a small amount of noise, including spurious data spikes. Therefore, in another embodiment, a second check to confirm the flat line signal is performed to determine whether or not the standard deviation of the signal changes when the gain is changed by some amount. If the standard deviation does not change with a change in the gain, then the microphone is assumed to be disconnected, and the gain will not be increased beyond the initial optimal value discussed above in Section 3.1.

3.5 Estimating the Background Noise Floor Envelope:

As noted above, the background noise floor envelope is estimated in order to detect if the analog microphone gain is set too low for any of the microphone channels. As is well known to those skilled in the art, advanced digital signal processing algorithms, such as conventional microphone array audio processing algorithms, can improve the signal-to-noise ratio (SNR) of the signal captured from the microphone array.

However, these advanced digital signal processing algorithms can only recover a signal that is above a certain minimum SNR. For example, it is not beneficial to digitize a signal that is 30 to 40 dB below the background noise floor because, even after sophisticated signal processing, the captured data is still noise. Therefore, in one embodiment, because the very low order bits are otherwise wasted, these bits are instead used to provide additional headroom to avoid clipping the desired speech signal as a function of the computed noise floor.

In particular, the envelope or maximum of the filtered microphone signal estimate can be viewed as an estimate of the envelope of the noise floor when no near end speech is present. Therefore, some minimum number of noise bits are digitized by making sure the noise floor envelope estimate is greater than or equal to the desired minimum number of noise bits. For example, assume that the desired noise floor envelope estimate is set to at least 3 bits. Since the signal estimate is based on the absolute value of the signal and not the raw signal, as noted above, this minimum noise floor threshold is approximately equal to 4 bits or 24 dB. Therefore, by setting the noise floor envelope to 3 bits, the System AGC ensures that any signal with a maximum dynamic range of 24 dB below the noise floor is digitized. Note that while setting the noise floor envelope to 3 bits was found to be a useful level in a tested embodiment, the 3 bit noise floor envelope is not a requirement, and any other desired noise floor envelope bit size may be used with the System AGC described herein.

In one embodiment, estimating the envelope of the microphone signal is accomplished by low-pass filtering the magnitude of the audio data signal in frame y and converting the result into an equivalent number of bits. To compute this estimate, a low pass filtered (i.e. smoothed) version of the microphone data is computed. As is known to those skilled in the art, there are an extremely large number of techniques for low pass filtering the data, any of which may be used by the System AGC described herein. For example, in a tested embodiment, a filtered estimate of the current audio data, $y_{Filt}(k,i)$, is provided by Equation 3, as illustrated below:

$$y_{Filt}(k,i) = (1-\alpha)y_{Filt}(k-1,i) + \alpha|y_{Mean}(k,i)|$$ Equation 3 where α is a smoothing parameter between 0 and 1, and $y_{Mean}(k,i)$ is the current mean adjusted, value read from the A/D for sample k and microphone channel i. Note that smoothing of the audio data will increase as the size of α decreases when using the exemplary smoothing filter of Equation 3.

In general, audio signals are complicated waveforms which include both positive and negative values. Because it is desired to attempt to update the gain which is a positive scale factor, the gain updates are based on the absolute value of the data from the A/D instead of the raw signal. Therefore, setting the parameter α is generally a trade off between potentially underestimating the noise floor envelope if α is too low, and generating spurious requests to increase the gain if α is too high.

In an alternate embodiment, a higher value of α is used in combination with a counter, such that the gain is only increased if the envelope estimate is observed to fall below the minimum threshold more than a specified number of times for a specific window in time. Other estimates of the noise floor, including estimates based on the spectrum of the noise floor, is also used in various additional embodiments of the System AGC.

In one embodiment, the System AGC checks the gain adjustment every sample. However, rather than checking the gain for every sample, in other embodiments, the gain check is done periodically, at some desired interval. In addition, in one embodiment, the number of samples between gain updates is performed as a function of the smoothing parameter, α. In particular, because as illustrated by Equation 3, the amount of smoothing applied increases as the size of α decreases, potential clipping of the signal also decreases. Consequently, in this embodiment, gain update checks will decrease in frequency as the size of α decreases. Conversely, gain update checks will increase in frequency as the size of α increases.

3.5.1 "Wait Time" Prior to Adjusting Gain:

After the filtered signal value for the current sample is calculated, it needs to be stored in a buffer so that the envelope estimate for this frame can later be calculated as the maximum value in the buffer. However in audio capture subsystems, previous gain changes are usually not applied to the new data captured by the A/D instantaneously. The period of time between when a new gain update is requested and when the new gain is actually applied to the signal received from the A/D is typically called the "wait time". This wait time is illustrated in FIG. 8.

In general, an upper bound on the wait time is easily determined experimentally by analyzing incoming audio data frames. However, if the frames of data captured from the hardware are shorter than the maximum wait time for the system plus the time required to make a new gain update estimate, the System AGC may need to aggregate two or more frames of audio data. Note that the number of frames that are to be aggregated depends entirely on the frame length relative to the time required for gain change orders to completely propagate through the system.

For example, as illustrated in FIG. 8, the System AGC module 300 first reads a current aggregated frame 800 (comprised of adjacent frames 805 and 810), and determines a new microphone gain (either an increase or decrease in gain). This new gain is sent to a driver interface 820 which in turn sends the new gain to a register 830 in the microphone or preamp hardware. The hardware applies the gain to the new data captured by the microphone (840 through 850).

Eventually, the data in the frame of data is passed to the System AGC for processing; however, it should be clear that the multilevel gain change order is not instantaneous. Therefore, the System AGC waits to detect or predict clipping and store the filtered samples in the buffer until after the "wait time" following any gain change request. Otherwise, future gain change requests may be based on data collected without the benefit of analyzing the effects of the most recently selected gain. Therefore, after the wait time has expired, the filtered samples are stored in the buffer to estimate the noise floor envelope.

In one embodiment, the analog gain is adjusted by first converting the computed noise floor envelope estimate to an equivalent number of bits using a log scale. For example, as illustrated by Equation 4, one method for converting the computed noise floor envelope estimate to an equivalent number of bits involves transforming the filtered values to an equivalent number of bits as follows:

$$y_{Filt-Bits}(k,i) = 20 \log_{10}(y_{Filt}(k,i))/20 \log_{10}(2) \quad \text{Equation 4}$$

However, it should be clear that the System AGC can also be implemented using linear arithmetic, such as by simply quantizing the filtered values to particular bit levels, in order to avoid the CPU consumption due to the computation of the logarithms.

3.6 Adjusting the Gain

Once the maximum wait time (see Section 3.5.1) has expired and the noise floor has been computed as described above, the next step is to determine whether the noise floor envelope for any channel of the microphone signals (or other audio input source) is too low, in which case, the gain is increased as described in further detail below. Conversely, if clipping has been detected or predicted, the gain is decreased, as described in further detail below.

As described above in Section 3.5, the filtered signal values were stored in each channel's buffer for the frame after the wait time had passed. Further, the noise floor envelope for each channel was determined to be the maximum filtered signal value stored in that channel's buffer for the aggregated frame. To determine if the noise floor envelope is too low for any channel, the minimum noise floor envelope for all channels for the current frame is determined to be the minimum noise floor for each of the individual noise floor estimates from all of the microphone channels (assuming that a global gain is to be set, otherwise, each channel is processed individually).

If the System AGC has detected that the signal has clipped or is likely to clip, the gain is decreased. The gain can be lowered by multiplying the current gain by any positive value less than one. Alternatively, the gain can be lowered by subtracting any positive value (less than the current gain) from the current gain. In either case, the resulting gain can not fall below the minimum gain value allowed by the microphone/preamp hardware. Therefore, if the new computed gain is less than the minimum value supported by the hardware, the new gain is simply set to the hardware's minimum value.

Otherwise, if the minimum noise floor envelope for all channels is less than the desired minimum number of bits (e.g., 3 desired bits for the noise floor envelope for 16-bit data, as discussed above), then the gain is increased. The gain can be increased by multiplying the current gain by any value greater than one. Alternatively, the gain can be increased by adding a positive value to the current gain. In either case, the resulting gain can exceed the maximum gain value allowed by the microphone/preamp hardware. Therefore, if the new computed gain is greater than the maximum gain supported by the hardware, the new gain is simply set to the maximum value allowed by the hardware. Otherwise, the gain is not adjusted for this aggregated frame.

Finally, since clipping typically presents more serious problems to signal processing algorithms than having a signal that is too quiet, it is often advantageous to have the rate at which the gain is decreased be greater than the rate at which is was increased. As for the actual levels of gain increase or decrease chosen, these values can be chosen as fixed step sizes, or as a function of either the noise floor, or the overhead left before signal clipping, depending upon whether the gain is to be increased or decreased.

The foregoing description of the System AGC for providing automatic system level gain control for one or more microphones, and parallel distribution of the microphone signal(s) to one or more independent applications has been presented for the purposes of illustration and description. It is not intended to be exhaustive or to limit the invention to the precise form disclosed. Many modifications and variations are possible in light of the above teaching. Further, it should be noted that any or all of the aforementioned alternate embodiments may be used in any combination desired to form additional hybrid embodiments of the System AGC. It is intended that the scope of the invention be limited not by this detailed description, but rather by the claims appended hereto.

What is claimed is:

1. A computer-readable storage device having computer executable instructions for automatically controlling audio input gain levels, comprising:
for each of one or more audio channels, estimating a background noise floor envelope through analysis of samples of a corresponding audio signal;
determining whether the background noise floor envelope falls below a predetermined threshold for any of the audio channels;
evaluating potential clipping of each of the audio signals resulting from an analog-to-digital conversion of the audio signals from each audio channel;
increasing the gain for any audio channel where the noise floor envelope falls below the predetermined threshold and the corresponding audio signal is not any of predicted to clip and actually clipped; and
decreasing the gain for any audio channel where the corresponding audio signal is any of predicted to clip and actually clipped.

2. The computer-readable storage device of claim 1 further comprising providing simultaneous copies of each of the audio signals from each audio channel to each of a plurality of independent audio processing applications.

3. The computer-readable storage device of claim 2 further comprising:
intercepting gain control commands issued by any of the independent audio processing applications;
responding to the corresponding independent audio processing applications so as to make it appear to the independent audio processing applications that the issued gain command was received and acted on by a preamp of the corresponding audio channel; and
applying digital gains corresponding to the intercepted gain control commands to the copies of the audio signals provided to each of the corresponding independent audio processing applications.

4. The computer-readable storage device of claim 1 wherein a single global gain value is applied to all audio channels, such that:
the gain is increased equally for all audio channels whenever the noise floor envelope of any of the audio channels falls below the predetermined threshold and none of the audio signals is any of predicted to clip and actually clipped; and
the gain is decreased equally for all audio channels whenever any audio signal of any audio channel is any of predicted to clip and actually clipped.

5. The computer-readable storage device of claim 1 wherein any adjustments to the gain, including increasing or decreasing the gain for any audio channel, are delayed for a period at least equal to a time required for an immediately preceding adjustment to the gain to have been applied to any samples of the corresponding audio signal used for estimating the background noise floor envelope.

6. The computer-readable storage device of claim 1 further comprising detecting whether any audio signal of any audio channel is a flat line signal, and preventing gain increases for any audio channel having a flat line signal.

7. A method for providing system level audio gain control, comprising using a computing device to:
provide a centralized gain control process for controlling the gain of preamplifiers associated with one or more audio sources coupled to the computing device;
provide simultaneous real-time copies each audio signal received from each of the audio sources to a plurality of independent audio processing applications;
preventing each of the independent audio processing applications from issuing gain control commands to any of the preamplifiers associated with any of the audio sources;
intercepting gain control commands issued by any of the independent audio processing applications; and
responding to the corresponding independent audio processing applications so as to make it appear to the independent audio processing applications that the issued gain command was received and acted on by a preamp of the corresponding audio source.

8. The method of claim 7 wherein preventing each of the independent audio processing applications from issuing gain control commands further comprises:
applying digital gains corresponding to the intercepted gain control commands to the copies of the audio signals provided to each of the corresponding independent audio processing applications.

9. The method of claim 7 wherein the gain applied to the preamplifiers associated with one or more audio sources is determined as a combined function of an estimated noise floor, and whether the audio signal received from one or more of the audio sources is any of predicted to clip and actually clipped during an analog-to-digital conversion of the audio signal.

10. The method of claim 7 wherein the centralized gain control process for controlling the gain of preamplifiers associated with one or more audio sources delays any gain control commands until after a period at least equal to a time required for an immediately preceding gain control command has propagated through to the corresponding preamplifiers.

11. The method of claim 7 further comprising determining whether any audio signal corresponding to any of the audio sources is a flat line signal, and preventing the centralized gain control process from increasing the gain of preamplifiers associated with the corresponding audio sources.

12. The method of claim 11 wherein determining whether any audio signal corresponding to any of the audio sources is a flat line signal comprises, for each audio source, subtracting a computed mean audio signal value from a current audio data frame of the corresponding audio signal and examining the resulting audio signal to determine whether it is a flat line audio signal.

13. A system for controlling audio source gain and distributing audio signals, comprising:
one or more audio sources coupled to a computing device;
one or more preamplifiers for providing a gain to each audio source;
providing system level centralized gain control commands to each preamplifier;
providing simultaneous real-time copies each audio signal received from each of the audio sources to a plurality of independent audio processing applications;

intercepting gain control commands issued by any of the independent audio processing applications; and responding to the corresponding independent audio processing applications so as to make it appear to the independent audio processing applications that any intercepted issued gain control command was received and acted on by the preamplifier of the corresponding audio source.

14. The system of claim 13 further comprising:

applying digital gains corresponding to the intercepted gain control commands to the copies of the audio signals provided to each of the corresponding independent audio processing applications.

15. The system of claim 13 wherein the gain control commands provided to each preamplifier includes a global gain value, such that:

the global gain is increased equally for two or more audio sources whenever a computed noise floor envelope of any of those audio sources falls below a predetermined threshold and none of those audio signals is any of predicted to clip and actually clipped; and the global gain is decreased equally for two or more audio sources whenever any audio signal of any of those audio sources is any of predicted to clip and actually clipped.

16. The system of claim 13 wherein the gain control commands provided to each preamplifier comprises:

determining whether any of the audio signals is any of predicted to clip and actually clipped during an analog-to-digital conversion of the audio signals from each audio source;

increasing the gain for any audio source where a computed noise floor envelope falls below a predetermined threshold and the corresponding audio signal is not any of predicted to clip and actually clipped; and decreasing the gain for any audio source where the corresponding audio signal is any of predicted to clip and actually clipped.

17. The system of claim 13 wherein any gain control commands are delayed for a period at least equal to a time required for any immediately preceding gain control commands to have been applied to each corresponding preamplifier.

18. The system of claim 13 further comprising detecting whether any audio signal of any audio source is a flat line signal, and preventing gain control orders from increasing the gain of any preamplifier corresponding to an audio source having flat line signal.

19. The system of claim 18 wherein detecting whether any audio signal of any audio source is a flat line signal comprises, for each audio source, subtracting a computed mean audio signal value from a current audio data frame of the corresponding audio signal and examining the resulting level of the current audio data frame.

* * * * *